(12) United States Patent  
Di Sarro et al.

(10) Patent No.: US 8,841,174 B1  
(45) Date of Patent: Sep. 23, 2014

(54) SILICON CONTROLLED RECTIFIER WITH INTEGRAL DEEP TRENCH CAPACITOR

(71) Applicant: International Business Machines Corporation, Armonk, NY (US)

(72) Inventors: James P. Di Sarro, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Chengwen Pei, Danbury, CT (US); Christopher S. Putnam, Hinesburg, VT (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/932,132

(22) Filed: Jul. 1, 2013

(51) Int. Cl.
  *H01L 21/332* (2006.01)
  *H01L 29/74* (2006.01)
  *H01L 29/66* (2006.01)

(52) U.S. Cl.
  CPC ...... *H01L 29/7408* (2013.01); *H01L 29/66371* (2013.01)
  USPC ..... 438/133; 438/140; 257/173; 257/E29.181

(58) Field of Classification Search
  CPC ............ H01L 27/0262; H01L 27/0259; H01L 27/0255; H01L 29/7436
  USPC ........... 257/107–182, E29.181; 438/133, 140
  See application file for complete search history.

(56) References Cited

U.S. PATENT DOCUMENTS

| | | |
|---|---|---|
| 4,734,725 A | 3/1988 | Bierman |
| 5,225,702 A | 7/1993 | Chatterjee |
| 5,400,202 A | 3/1995 | Metz et al. |
| 6,081,002 A | 6/2000 | Amerasekera et al. |
| 6,384,452 B1 | 5/2002 | Chittipeddi et al. |
| 6,433,985 B1 | 8/2002 | Voldman et al. |
| 6,503,793 B1 | 1/2003 | Chittipeddi et al. |
| 6,750,515 B2 | 6/2004 | Ker et al. |
| 7,285,458 B2 | 10/2007 | Manna et al. |
| 7,615,417 B2 | 11/2009 | Manna et al. |
| 7,825,473 B2 | 11/2010 | Ker et al. |
| 7,986,502 B2 | 7/2011 | Sorgeloos |
| 8,120,142 B2 | 2/2012 | Bobde |
| 8,134,211 B2 | 3/2012 | Manna et al. |
| 8,338,915 B2 | 12/2012 | Mallikararjunaswamy et al. |
| 2008/0042208 A1 | 2/2008 | Hshieh |
| 2010/0001283 A1 | 1/2010 | Manna et al. |
| 2012/0099229 A1 | 4/2012 | Domanski et al. |

OTHER PUBLICATIONS

Pei, et al. "A Novel, Low-Cost Deep Trench Decoupling Capacitor for High-Performance, Low-Power Bulk CMOS Applications", 9th International Conference on Solid-State and Integrated-Circuit Technology, 2008. ICSICT 2008.

*Primary Examiner* — Tucker Wright
(74) *Attorney, Agent, or Firm* — Wood, Herron & Evans LLP; Anthony J. Canale

(57) ABSTRACT

Device structures and design structures that include a silicon controlled rectifier, as well as fabrication methods for such device structures. A well is formed in the device layer of a silicon-on-insulator substrate. A silicon controlled rectifier is formed that includes an anode in the well. A deep trench capacitor is formed that includes a plate coupled with the well. The plate of the deep trench capacitor extends from the device layer through a buried insulator layer of the silicon-on-insulator substrate and into a handle wafer of the silicon-on-insulator substrate.

8 Claims, 8 Drawing Sheets

SILICON CONTROLLED RECTIFIER WITH INTEGRAL DEEP TRENCH CAPACITOR

BACKGROUND

The present invention relates to semiconductor device fabrication and, more specifically, to device structures and design structures for a silicon controlled rectifier, as well as methods of fabricating a device structure for a silicon controlled rectifier.

An integrated circuit may be exposed to random electrostatic discharge (ESD) events that can direct potentially large and damaging ESD currents to the integrated circuits of the chip. An ESD event refers to a phenomenon of electrical discharge of a current (positive or negative) for a short duration, during which a large amount of current is provided to the integrated circuit. The high current may be built-up from a variety of sources, such as the human body. Among the sources of exposure to ESD events are the human body described by the Human Body Model, metallic objects described by the Machine Model, and the integrated circuit itself should it charge and discharge to ground as described by the Charged Device Model.

Precautions may be taken to avoid causing ESD events or to protect an integrated circuit from ESD events. One such precaution for protecting the integrated circuit is to incorporate an ESD prevention circuit into the chip. The ESD protection circuit prevents damage to the sensitive devices of the integrated circuits during post-manufacture chip handling and after chip installation on a circuit board or other carrier. If an ESD event occurs, the ESD protection circuit triggers an ESD protection device, such as a silicon-controlled rectifier, to enter a low-impedance, conductive state that directs ESD current to ground and away from the sensitive devices in the integrated circuit on the chip. The ESD protection device clamps the ESD protection device in its conductive state until the ESD current is drained and the ESD voltage is discharged to an acceptable level.

One type of protection device that can be deployed in an ESD protection circuit is a silicon-controlled rectifier (SCR). The SCR is a unidirectional four-layer solid state device utilized in current control applications and includes three electrodes or terminals, namely an anode, a cathode, and a gate, that are distributed among the four layers. In its quiescent state, the SCR restricts current conduction to leakage current. However, a signal applied to the gate that causes the gate-to-cathode voltage to exceed an engineered threshold, known as the trigger voltage, can initiate the conduction of a forward current between the anode and cathode. In response to the triggering signal being removed from the gate, the SCR continues to conduct the forward current so long as the conducted current remains above an engineered holding current. When the conducted current drops below the holding current, the SCR returns to its quiescent state.

Improved device structures and design structures that include a silicon controlled rectifier, as well as fabrication methods, are needed.

SUMMARY

According to one embodiment of the present invention, a method of fabricating a device structure is provided that uses a silicon-on-insulator substrate having a device layer, a handle wafer, and a buried insulator layer between the device layer and the handle wafer. The method includes forming a well in the device layer and forming an anode of a silicon controlled rectifier in the well. The method further includes forming a plate of a deep trench capacitor that is coupled with the well and that extends from the device layer through the buried insulator layer and into the handle wafer.

According to another embodiment of the present invention, a device structure is provided that is fabricated using a silicon-on-insulator substrate having a device layer, a handle wafer, and a buried insulator layer between the device layer and the handle wafer. The device structure includes a well in the device layer and a silicon controlled rectifier including an anode in the well. The device structure further includes a deep trench capacitor with a plate coupled with the well. The plate of the deep trench capacitor extends from the device layer through the buried insulator layer and into the handle wafer.

According to another embodiment of the present invention, a design structure is provided that is readable by a machine used in design, manufacture, or simulation of an integrated circuit. The design structure includes a well in a device layer of a silicon-on-insulator substrate, a silicon controlled rectifier including an anode in the well, and a deep trench capacitor including a plate coupled with the well. The plate of the deep trench capacitor extends from the device layer through a buried insulator layer of the silicon-on-insulator substrate and into a handle wafer of the silicon-on-insulator substrate. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
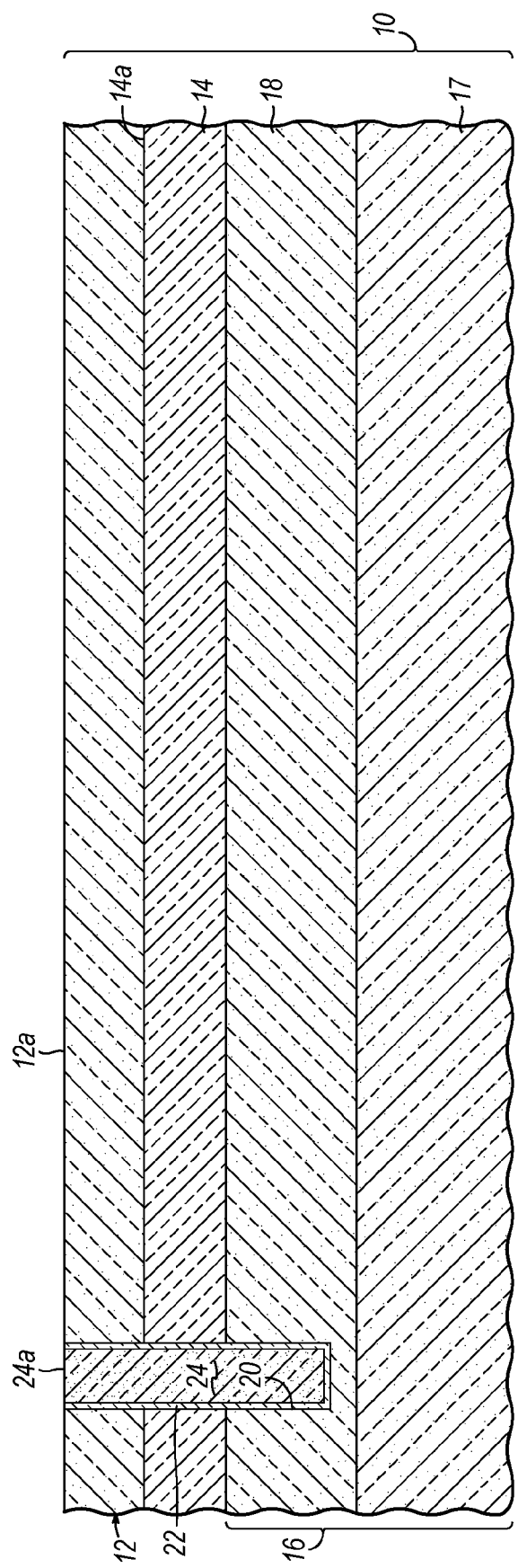
FIGS. 1-4 are cross-sectional views of a portion of a substrate at successive stages of a processing method for fabricating a device structure in accordance with an embodiment of the invention.

With reference to FIG. 1 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is considerably thinner than the handle wafer 16. The device layer 12 is supported on a top surface 14a of the buried insulator layer 14 and is electrically insulated from the handle wafer 16 by the buried insulator layer 14. The buried insulator layer 14 may be comprised of an electrical insulator and, in particular, may constitute a buried oxide layer comprised of silicon dioxide (e.g., $SiO_2$).

The handle wafer 16 includes a bulk substrate 17 and an epitaxial layer 18 on the handle wafer 16. The device layer 12, the bulk substrate 17, and the epitaxial layer 18 may be comprised of a semiconductor material, such as single crystal silicon or another single crystal semiconductor material that contains primarily silicon. In one embodiment, the semiconductor material comprising bulk substrate 17 and the semiconductor material comprising the epitaxial layer 18 may be oppositely doped. For example, the epitaxial layer 18 may be doped heavily n-type and the bulk substrate 17 may be doped lightly p-type.

A deep trench 20 extends from a top surface 12a of the device layer 12 through the device layer 12 and the buried insulator layer 14, and penetrates to a depth within the epitaxial layer 18. The penetration depth of the deep trench 20 does not reach the handle wafer 16. The deep trench 20 may be formed by applying a hardmask, patterning the hardmask with photolithography and etching, and then using a reactive ion etch (RIE) process to define the deep trench.

An insulator layer 22 is formed on the sidewalls of the deep trench 20 as a liner and operates as a capacitor dielectric in the device structure. The insulator layer 22 may be comprised of a conformal layer comprised of an electrical insulator, such a high-k dielectric deposited by atomic layer deposition (ALD). The high-k dielectric material comprising insulator layer 22 may be a hafnium-based dielectric material such as hafnium dioxide ($HfO_2$) or hafnium silicate ($HfSiO_4$), aluminum oxide ($Al_2O_3$), or a layered stack of these or other similar materials.

The deep trench 20 is filled with a plug 24 comprised of an electrical conductor after being lined with the insulator layer 22. A thin layer comprised of a metal may be deposited to coat the insulator layer 22 before the plug 24 is formed. In one embodiment, the electrical conductor constituting plug 24 may comprise doped polycrystalline silicon (i.e., polysilicon) that is deposited by chemical vapor deposition (CVD). The plug 24 has a top surface 24a that is proximate to the top surface 12a of device layer 12. Extraneous electrical conductor may be removed from the top surface 12a by, for example, planarizing with chemical mechanical polishing (CMP).

Figure 2:
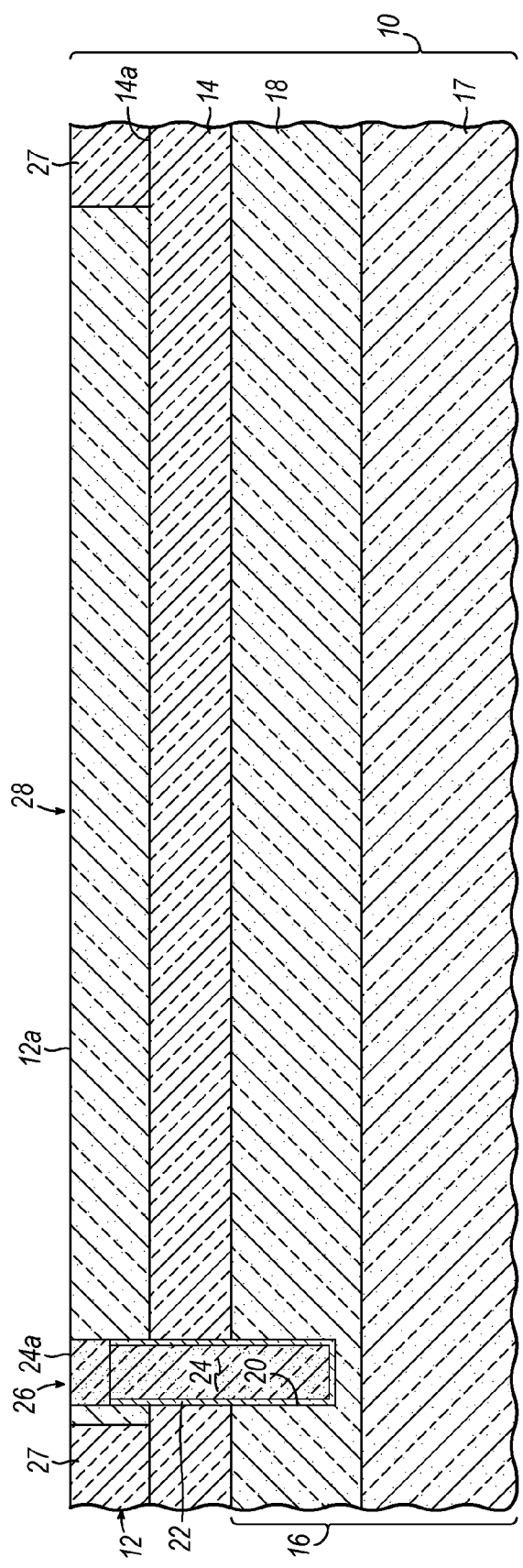

With reference to FIG. 2 in which like reference numerals refer to like features in FIG. 1 and at a subsequent fabrication stage, the top surface 24a of the plug 24 is recessed relative to the top surface 12a of device layer 12 by a wet or dry etch process that removes the semiconductor material of the plug 24 selective to the semiconductor material of the device layer 12. The recessed depth extends only partially through the thickness of the device layer 12. The thin metal layer and the insulator layer 22 are then removed over the recessed depth from the sidewalls of the deep trench 20 by one or more wet or dry etch processes that remove the constituent materials selective to the semiconductor material of the device layer 12. The plug 24 is then refilled level with the top surface 12a of device layer 12 by depositing a conducting material, which may be the same conductive material as the original fill (e.g., doped polysilicon), and planarizing with CMP.

The epitaxial layer 18 and plug 24 operate as the electrodes or plates of a deep trench capacitor, generally indicated by reference numeral 26. The insulator layer 22 defines a capacitor dielectric of the deep trench capacitor 26 that is positioned between the plates. The plug 24 defines an inner plate of the deep trench capacitor 26 that is separated by the insulator layer 22 from the outer plate of the deep trench capacitor 26 defined by the epitaxial layer 18.

Trench isolation regions 27 are formed in the device layer 12 that supply electrical isolation for a device region 28 of the device layer 12. The locations and arrangement of the trench isolation regions 27 define the size, geometrical shape, and outer perimeter of the device region 28. The trench isolation regions 27 may be formed by a shallow trench isolation (STI) technique that relies on lithography and dry etching processes to define trenches that reach in depth to the top surface 14a of the buried insulator layer 14, deposit an electrical insulator to fill the trenches, and planarize the electrical insulator relative to the top surface 12a of the device layer 12 using, for example, CMP. The trench isolation regions 27 may be comprised of a dielectric material, such as an oxide of silicon and, in particular, may be comprised of tetraethylorthosilicate (TEOS) deposited by CVD.

Figure 3:
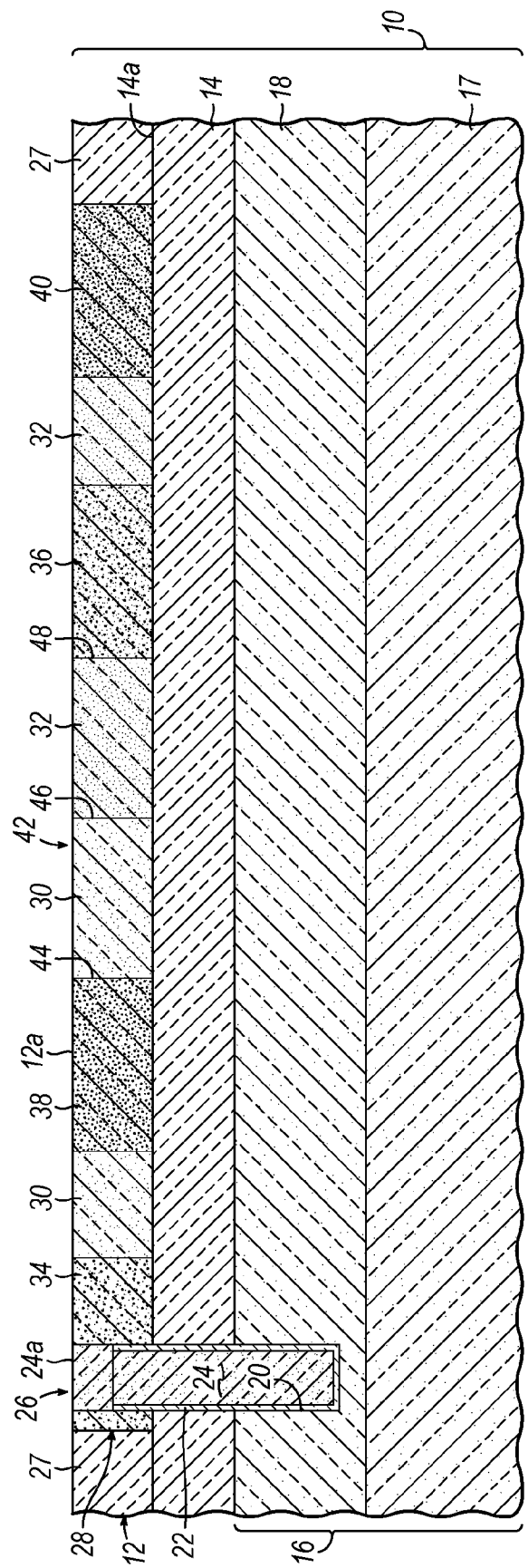

With reference to FIG. 3 in which like reference numerals refer to like features in FIG. 2 and at a subsequent fabrication stage, juxtaposed wells 30, 32 and contacts 34, 36, 38, 40 are formed in the device layer 12 within device region 28. The wells 30, 32 may be formed before the contacts 34, 36, 38, 40 are formed.

Wells 30, 32, which are abutting, are comprised of lightly-doped semiconductor material of opposite conductivity types. Well 30 is formed by introducing an impurity species at a selected location in the device layer 12 to supply an electrically-active dopant. In one embodiment, ions of an impurity species may be implanted into the device region 28 of device layer 12 in the presence of a patterned sacrificial mask applied to the top surface of the device layer 12. Well 32 is formed by introducing a different impurity species at a different selected location in the device layer 12 to supply an electrically-active dopant. In one embodiment, ions of an impurity species may be implanted into the device region 28 in the presence of a different patterned mask applied to the top surface of the device layer 12. The semiconductor material of well 30 may comprise an n-type impurity species from Group V of the Periodic Table (e.g., phosphorus (P) or arsenic (As)) effective to impart n-type conductivity. The semiconductor material of well 32 may comprise a p-type impurity species selected from Group III of the Periodic Table (e.g., boron) effective to impart p-type conductivity.

Each patterned sacrificial mask controls dopant introduction into device region 28 during implantation by stopping the implanted ions within its thickness so that the device layer 12 is selectively implanted with the impurity species to respectively form the wells 30, 32. Each patterned sacrificial mask may be a photoresist layer having a window aligned with the intended location of one of the wells 30, 32 and formed in the respective mask using a photolithographic patterning process. Implantation conditions (e.g., kinetic energy and dose) are selected to form each of the wells 30, 32 with a desired doping profile and concentration (e.g., light doping). After each ion implantation is completed, each patterned mask is removed by, for example, oxygen plasma ashing or wet chemical stripping. Well 32 can be formed either before or after well 30 is formed.

Contacts 34, 36 have the same conductivity type and are respectively formed in well 30 and well 32. Contact 34 is comprised of heavily-doped semiconductor material having the same conductivity type as well 30 and contact 36 is comprised of heavily-doped semiconductor material having the opposite conductivity type from well 32. Contact 34 coincides in location with the portion of the deep trench capacitor 26 in device layer 12. Contact 34 may be directly coupled with the refilled portion of plug 24 of the deep trench capacitor 26 in device layer 12 that lacks the insulator layer 22 so that the contact 34 is directly coupled with the capacitor plate defined by plug 24. The contact 34 couples the well 30 with the plug 24 so that the well 30 is coupled with the capacitor plate defined by plug 24.

Contacts 34, 36 are formed by introducing an impurity species at selected locations in the device layer 12 to supply an electrically-active dopant. In one embodiment, ions of an impurity species may be implanted into the device region 28 of the device layer 12 in the presence of a patterned sacrificial mask (not shown) applied to the top surface of the device layer 12. The semiconductor material of contacts 34, 36 may comprise an n-type impurity species effective to impart n-type conductivity.

In one embodiment, ions of an impurity species may be implanted into the device region 28 in the presence of a patterned sacrificial mask (not shown) applied to the top surface of the device layer 12. The patterned sacrificial mask controls dopant introduction into device region 28 during implantation by stopping the implanted ions within its thickness so that the device layer 12 is selectively implanted with the impurity species to form the contacts 34, 36. The patterned sacrificial mask may be a photoresist layer having windows aligned with the intended location of contacts 34, 36 and formed in the respective mask using a photolithographic patterning process. Implantation conditions are selected to form each of the contacts 34, 36 with a desired doping profile and concentration (e.g., heavy doping). After the ion implantation is completed, the patterned mask is removed by, for example, oxygen plasma ashing or wet chemical stripping.

Contacts 38, 40 are respectively formed in well 30 and well 32. Contact 38 is comprised of heavily-doped semiconductor material having the opposite conductivity type from well 30 and contact 40 is comprised of heavily-doped semiconductor material having the same conductivity type as well 32. Contacts 38, 40 are formed by introducing a different impurity species at selected locations in the device layer 12 to supply an electrically-active dopant. The semiconductor material of contacts 38, 40 may comprise a p-type impurity species effective to impart p-type conductivity.

In one embodiment, ions of an impurity species may be implanted into the device region 28 in the presence of a patterned sacrificial mask (not shown) applied to the top surface of the device layer 12. The patterned sacrificial mask controls dopant introduction into device region 28 during implantation by stopping the implanted ions within its thickness so that the device layer 12 is selectively implanted with the impurity species to form the contacts 38, 40. The patterned sacrificial mask may be a photoresist layer having windows aligned with the intended location of contacts 38, 40 and formed in the respective mask using a photolithographic patterning process. Implantation conditions are selected to form each of the contacts 38, 40 with a desired doping profile and concentration (e.g., heavy doping). After the ion implantation is completed, the patterned mask is removed by, for example, oxygen plasma ashing or wet chemical stripping. Contacts 34, 36 can be formed either before or after contacts 38, 40 are formed.

As used herein, the dopant concentration in semiconductor material that is considered heavily doped may be at least an order of magnitude higher than the dopant concentration in semiconductor material that is considered lightly doped. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

The resultant device structure includes a silicon controlled rectifier (SCR) 42 in addition to the deep trench capacitor 26. Contact 38 comprises an anode of the SCR 42 and contact 36 comprises a cathode of the SCR 42. The SCR 42 includes p-n junctions 44, 46, 48 across each of which the conductivity type of the semiconductor material changes. Contact 38 is butted with well 30 to define the p-n junction 44, well 30 is butted with well 32 to define the p-n junction 46, and well 32 is butted with contact 36 to define the p-n junction 48.

Figure 4:
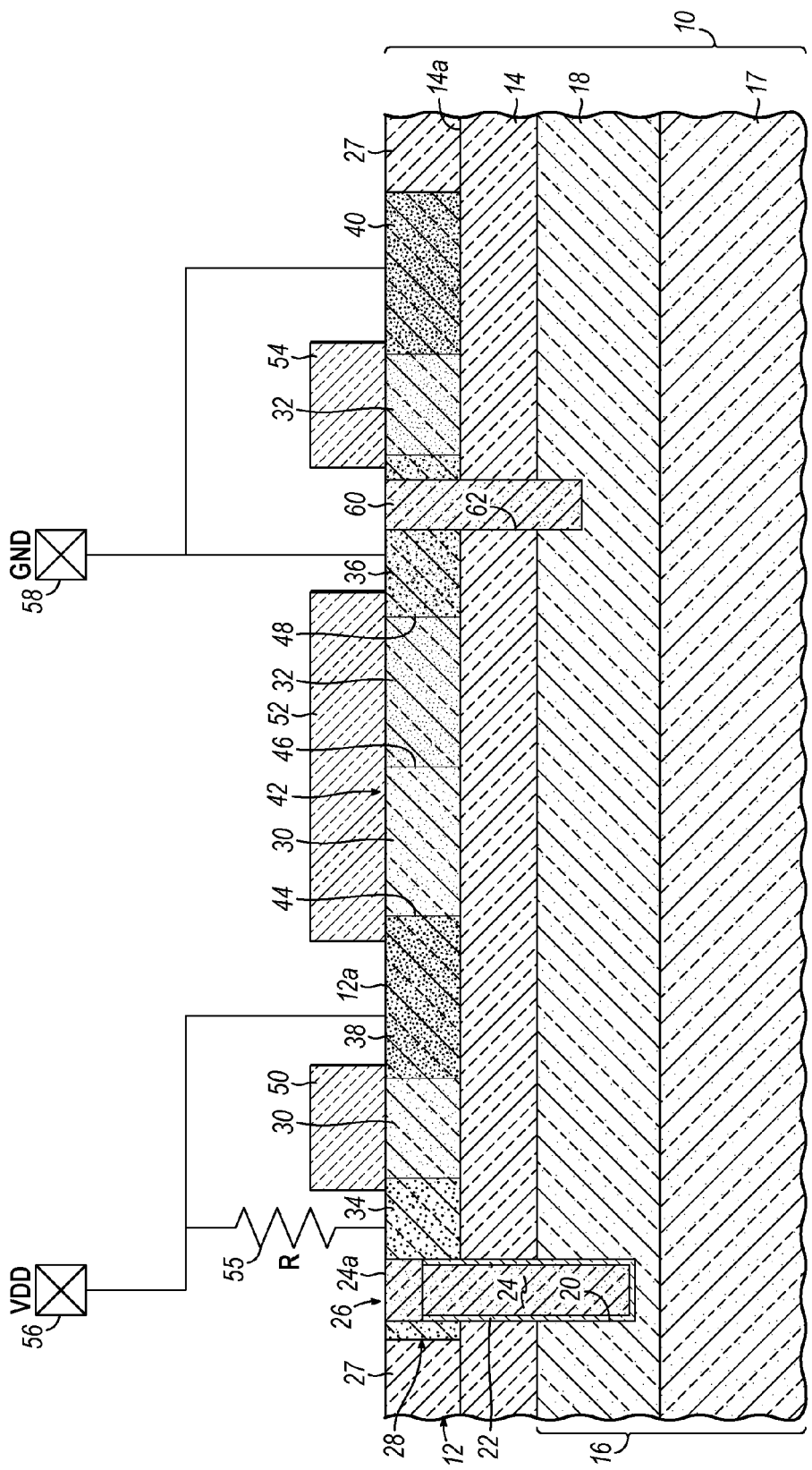
Figure 5:
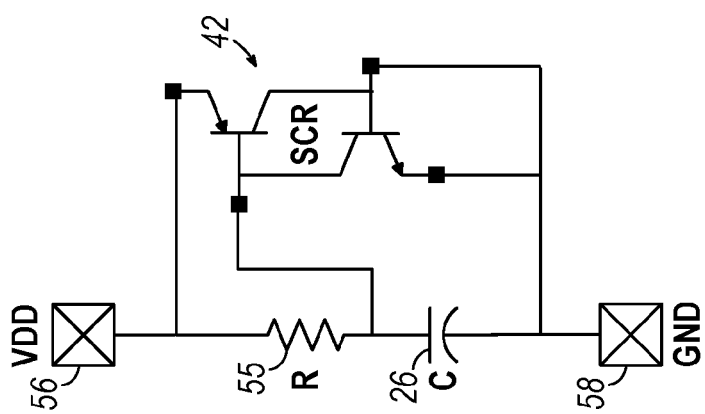
FIG. 5 is a schematic view of the electrical configuration of the device structure of FIG. 4.

With reference to FIGS. 4-5 in which like reference numerals refer to like features in FIG. 3 and at a subsequent fabrication stage, features 50, 52, 54 are formed on the top surface 12a of device layer 12 in device region 28. Feature 50 primarily covers a portion of well 30 between contacts 34 and 38. Feature 52 primarily covers the abutting portions of well 30 and well 32 between contacts 36 and 38. Feature 54 primarily covers a portion of well 32 between contacts 36 and 40. A silicide layer may be formed on surface areas of the top surface 12a of the device layer 12 not covered by features 50, 52, 54.

The features 50, 52, 54 may be comprised of a non-conductive dielectric material that is an electrical insulator. In one embodiment, the features 50, 52, 54 may be comprised of a material, such as a nitride, oxide, or oxynitride of silicon deposited by CVD or physical vapor deposition (PVD), that is used in a CMOS process to block silicide formation. The features 50, 52, 54 may be patterned from a layer of the non-conductive dielectric material using photolithography and etching processes. To that end, the layer of the non-conductive dielectric material is deposited and a sacrificial layer is subsequently applied. The sacrificial layer may be comprised of a photoresist that is applied by a spin coating process, pre-baked, exposed to a radiation projected through a photomask, baked after exposure, and developed with a chemical developer to form an etch mask that includes features coinciding with the intended locations of features 50, 52, 54. The feature is transferred from the sacrificial layer by the etching process to the layer to define the boundaries of the features 50, 52, 54. The etching process may comprise a wet chemical etching process or dry etching process, such as RIE. The sacrificial layer is then removed. If comprised of a photoresist, the sacrificial layer may be removed by ashing or solvent stripping, followed by surface cleaning.

A trench contact 60 is formed that may be directly coupled with the cathode of the SCR 42 and that directly couples the cathode (i.e., contact 36) of the SCR 42 with the epitaxial layer 18 (i.e., the outer plate of the deep trench capacitor 26). The trench contact 60 is located in a trench 62 that extends from a top surface 12a of the device layer 12 through the device layer 12 and the buried insulator layer 14, and penetrates to a depth within the epitaxial layer 18. The penetration depth of the trench 62 for trench contact 60 does not reach the handle wafer 16. The trench 62 may be formed by applying a hardmask, patterning the hardmask with photolithography and etching, and then using a reactive ion etch (RIE) process. The trench contact 60 may comprise an electrical conductor, such as doped polycrystalline silicon (i.e., polysilicon) deposited by chemical vapor deposition (CVD). Extraneous conductive material may be removed from the top surface 12a by planarizing with CMP.

During the front-end-of-line (FEOL) portion of the fabrication process, the device structure comprising the deep trench capacitor 26 and SCR 42 may be replicated at various locations across at least a portion of the surface area of the substrate 10. Standard middle-end-of-line (MEOL) and back-end-of-line (BEOL) processing follows, which includes formation of contacts and wiring for the local MOL interconnect structure overlying the deep trench capacitor 26 and SCR 42, and formation of dielectric layers, via plugs, and wiring for the BEOL interconnect structure coupled by the local interconnect wiring with the deep trench capacitor 26 and SCR 42.

A resistor 55 is coupled in a circuit path between one plate of the deep trench capacitor 26 and a power pad 56. Alternatively, the circuit path containing the resistor 55 may be couple the capacitor 26 with an input/output (I/O) pad instead of power pad 56. The resistor 55 may be included in one or more of the BEOL levels, in the MOL, or in the FEOL. The deep trench capacitor 26 and resistor 55 collectively comprise an RC-trigger circuit that may trigger the SCR 42 upon the occurrence of an electrostatic discharge (ESD) event. The cathode of the SCR 42 (i.e., contact 36) is coupled in a circuit path with a ground pad 58.

When triggered by the RC-trigger circuit, the SCR 42 diverts the current from the ESD pulse at power pad 56 to ground and away from sensitive integrated circuits to provide ESD protection. The SCR 42 is held in the low-impedance conducting state so long as the ESD current is flowing through the current-carrying path. At the conclusion of the ESD event, the SCR 42 reverts to its high-impedance non-conducting state and remains off until the RC-trigger circuit is once again triggered by an ESD pulse.

Figure 7:
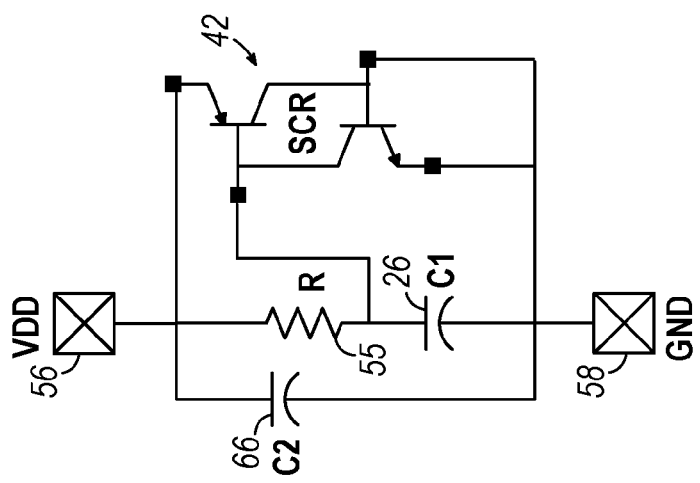
FIG. 7 is a schematic view of the electrical configuration of the device structure of FIG. 6.
Figure 6:
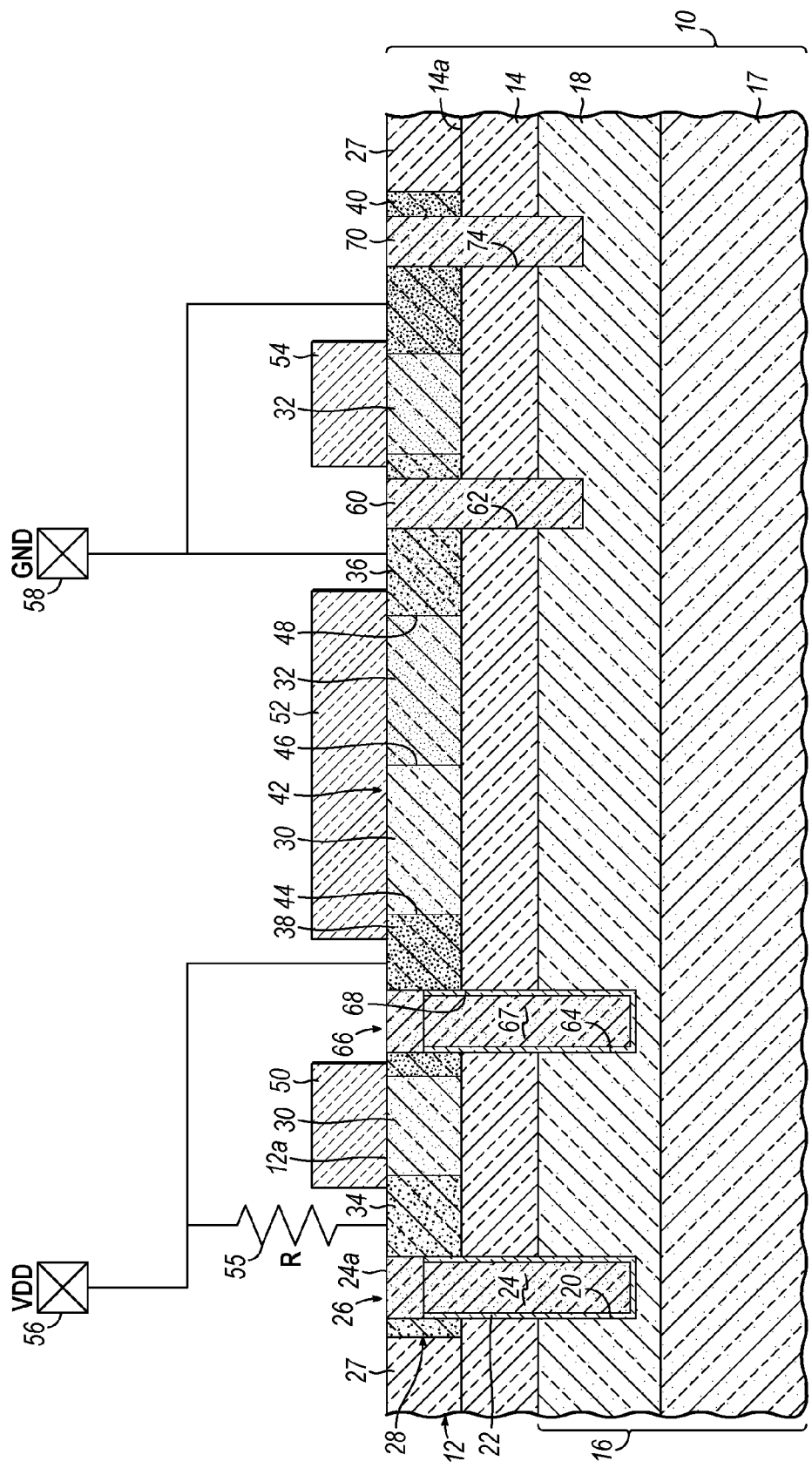
FIG. 6 is a cross-sectional view similar to FIG. 4 of a device structure in accordance with an alternative embodiment of the invention.

With reference to FIGS. 6-7 in which like reference numerals refer to like features in FIGS. 4-5 and in accordance with an alternative embodiment of the invention, the device structure is modified to add another deep trench capacitor 66 and another trench contact 70. The deep trench capacitor 66 is similar in construction to the deep trench capacitor 26 and may be concurrently formed with the deep trench capacitor 26. The deep trench capacitor 66 includes a plug 67 comprising an inner plate and an insulator layer 68 between the plug 67 and the epitaxial layer 18 operating as an outer plate. The plug 47 of the deep trench capacitor 66 is positions in a deep trench 64 that is similar to deep trench 20. The deep trench 64 extends from a top surface 12a of the device layer 12 through the device layer 12 and the buried insulator layer 14, and penetrates to a depth within the epitaxial layer 18. The penetration depth of the deep trench 20 does not reach the handle wafer 16. At its upper end, the inner plate of the deep trench capacitor 66 is coupled with the anode (i.e., contact 38) of the SCR 42.

The trench contact 70 is similar in construction to the trench contact 60 and may be concurrently formed with the trench contact 60. The trench contact 70 is located in a trench 74 that extends from a top surface 12a of the device layer 12 through the device layer 12 and the buried insulator layer 14, and penetrates to a depth within the epitaxial layer 18. The penetration depth of the trench 74 for trench contact 70 does not reach the handle wafer 16. The trench contact 70 couples the epitaxial layer 18 with the contact 40 so that the outer plate of the deep trench capacitor 66 can be coupled by the interconnect structure with the cathode of the SCR 42 and the ground pad 58.

The deep trench capacitor 66 is connected between the anode (i.e., contact 38) and cathode (i.e., contact 40) of the SCR 42. The deep trench capacitor 66 operates as a decoupling capacitor from the power pad 56 to the ground pad 58, which may improve ESD performance. For example, during an ESD event, the deep trench capacitor 66 may absorb some of the charge from the ESD event.

Figure 9:
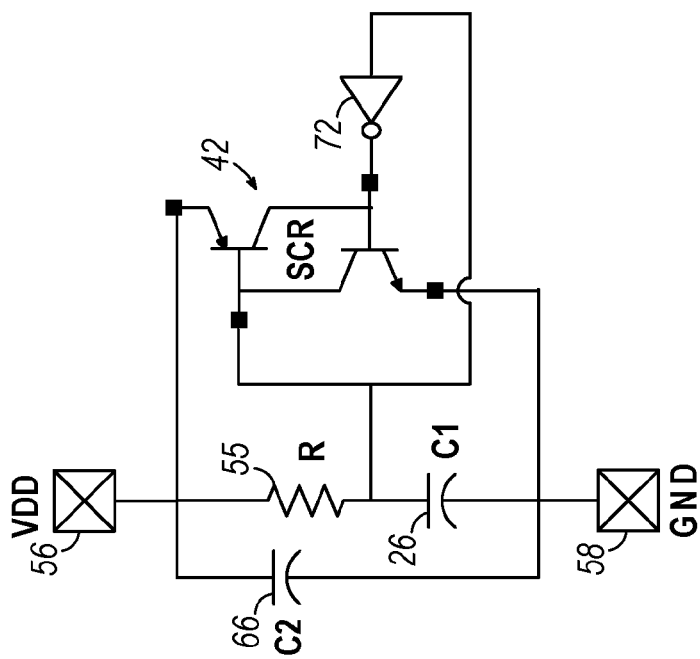
FIG. 9 is a schematic view of the electrical configuration of the device structure of FIG. 8.
Figure 8:
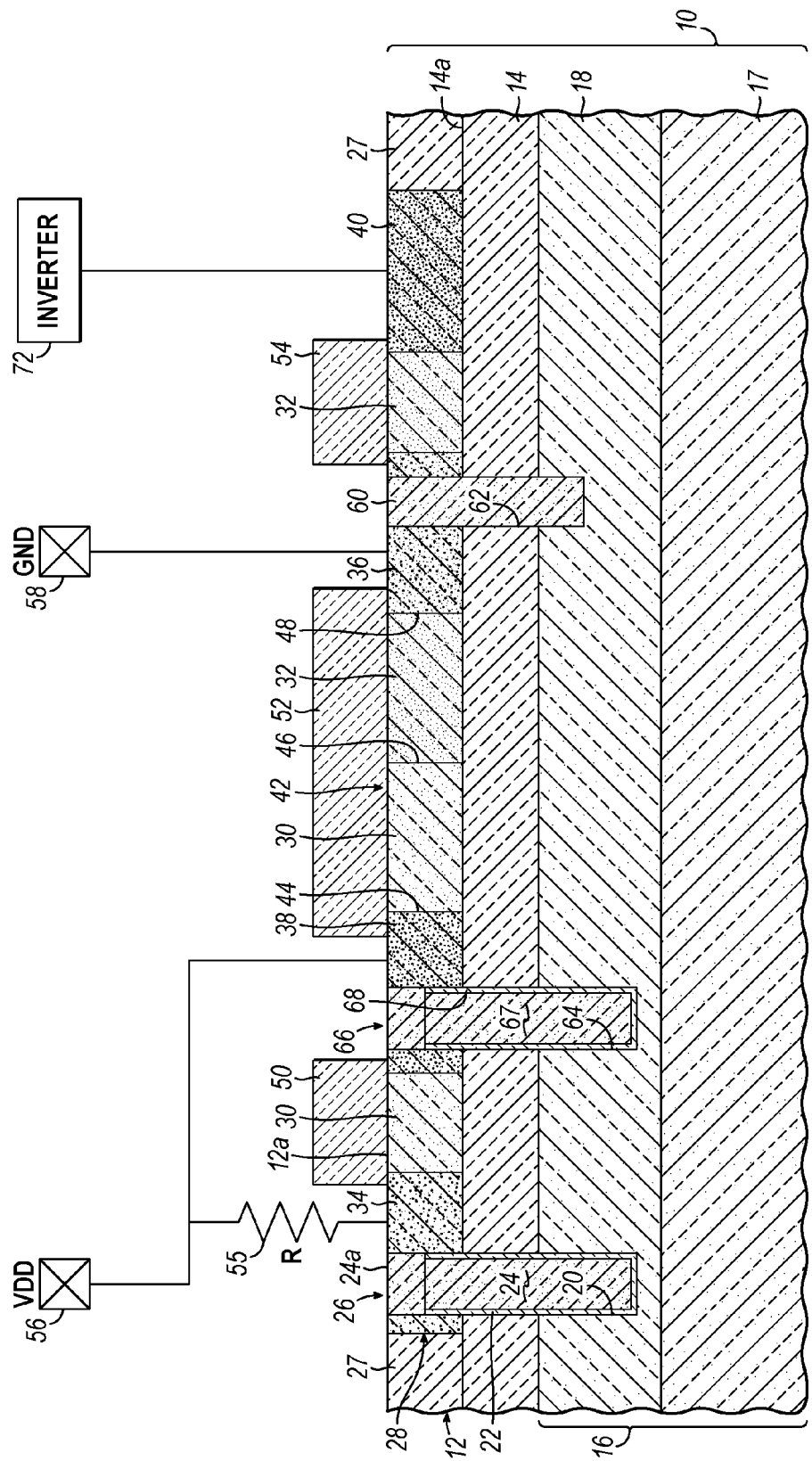
FIG. 8 is a cross-sectional view similar to FIG. 6 of a device structure in accordance with an alternative embodiment of the invention.

With reference to FIGS. 8-9 in which like reference numerals refer to like features in FIGS. 6-7 and in accordance with an alternative embodiment of the invention, the device structure is modified to eliminate the trench contact 70 and to instead couple the contact 40 with an inverter 72. This modification provides dual body triggering by the RC circuit comprised of deep trench capacitor 26 and resistor 55 in that the body defined by well 32 is triggered in addition to the body defined by well 30, which may lower the trigger current and voltage of the SCR 42.

Figure 10:
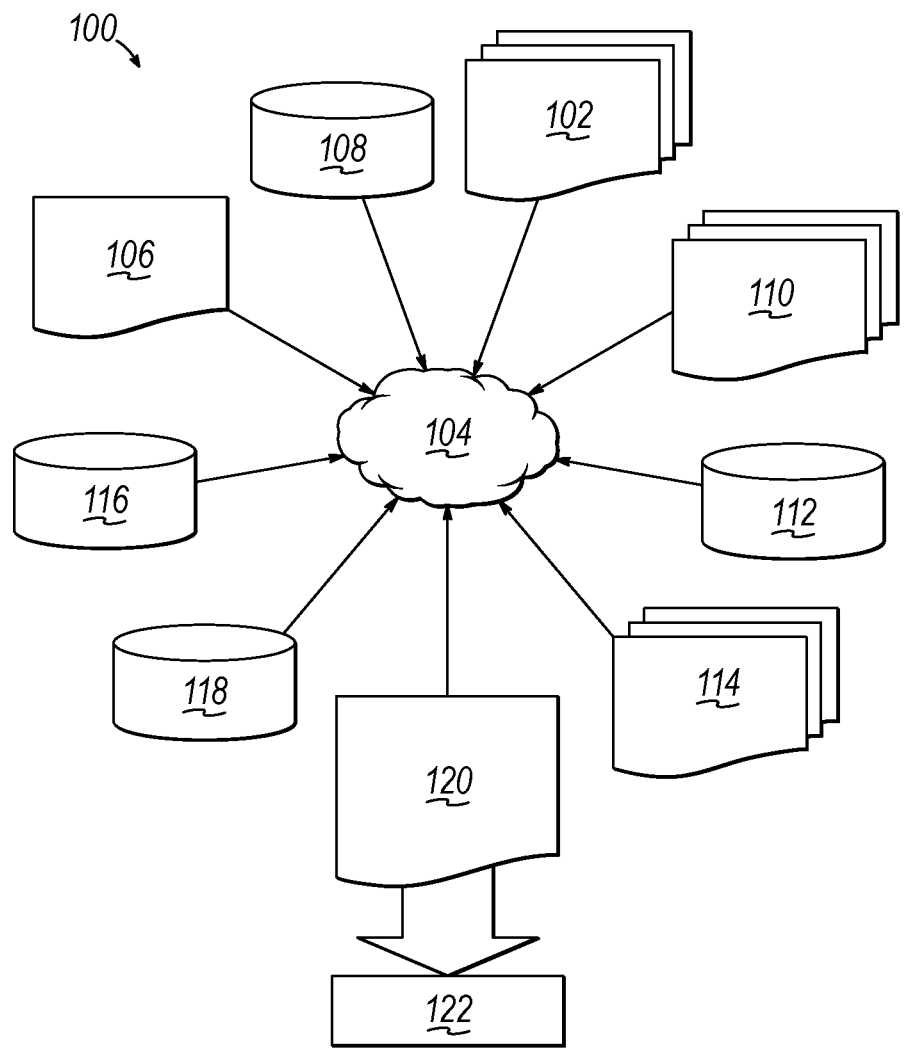
FIG. 10 is a flow diagram of a design process used in semiconductor design, manufacture, and/or test.

FIG. 10 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 4-5, FIGS. 6-7, AND FIGS. 8-9. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 4-5, FIGS. 6-7, AND FIGS. 8-9. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 4-5, FIGS. 6-7, AND FIGS. 8-9 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-5, FIGS. 6-7, AND FIGS. 8-9. In one embodiment, design structure 120 may comprise a compiled, executable HDL simulation model that functionally simulates the devices shown in FIGS. 4-5, FIGS. 6-7, AND FIGS. 8-9.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4-5, FIGS. 6-7, AND FIGS. 8-9. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure using a silicon-on-insulator substrate having a device layer, a handle wafer, and a buried insulator layer between the device layer and the handle wafer, the method comprising:
   forming a first well in the device layer;
   forming an anode of a silicon controlled rectifier in the first well; and forming a first plate of a first deep trench capacitor that is coupled with the first well and that extends from the device layer through the buried insulator layer and into the handle wafer.

2. The method of claim 1 further comprising:
forming a second well in the device layer that abuts the first well to define a junction of the silicon controlled rectifier;
forming a cathode of the silicon controlled rectifier in the second well; and
forming a plurality of trench isolation regions that bound the first well and the second well.

3. The method of claim 1 wherein the first deep trench capacitor includes a second plate defined by an epitaxial layer of the handle wafer, and further comprising:
forming a dielectric layer of the first deep trench capacitor that lines a deep trench in which the first plate is formed and that separates the second plate from the first plate.

4. The method of claim 3 further comprising:
forming a second well in the device layer that abuts the first well to define a junction of the silicon controlled rectifier;
forming a cathode of the silicon controlled rectifier in the second well; and
forming a trench contact that couples the cathode with the second plate of the first deep trench capacitor and that extends from the device layer through the dielectric layer and into the handle wafer.

5. The method of claim 1 further comprising:
forming a first plate of a second deep trench capacitor that is coupled with the anode of the silicon controlled rectifier and that extends from the device layer through the buried insulator layer and into the handle wafer.

6. The method of claim 5 wherein the second deep trench capacitor includes a second plate defined by an epitaxial layer of the handle wafer, and further comprising:
forming a second well in the device layer that abuts the first well to define a junction of the silicon controlled rectifier;
forming a cathode of the silicon controlled rectifier in the second well; and
forming a trench contact that couples the cathode of the silicon controlled rectifier with the second plate of the second deep trench capacitor and that extends from the device layer through the buried insulator layer and into the handle wafer.

7. The method of claim 6 further comprising:
an inverter coupled with the second well.

8. The method of claim 1 further comprising:
forming a pad coupled with the anode of the silicon controlled rectifier; and
coupling the pad with the first plate of the first deep trench capacitor through a resistor,
wherein the resistor and the first deep trench capacitor define an RC-trigger circuit to trigger the silicon controlled rectifier upon occurrence of an electrostatic discharge event.

* * * * *